US011605760B2

(12) United States Patent
Ahmed

(10) Patent No.: US 11,605,760 B2
(45) Date of Patent: Mar. 14, 2023

(54) MICRO LIGHT-EMITTING DIODE DISPLAYS HAVING NANOPHOSPHORS

(71) Applicant: Intel Corporation, Santa Clara, CA (US)

(72) Inventor: Khaled Ahmed, Anaheim, CA (US)

(73) Assignee: Intel Corporation, Santa Clara, CA (US)

( * ) Notice: Subject to any disclaimer, the term of this patent is extended or adjusted under 35 U.S.C. 154(b) by 964 days.

(21) Appl. No.: 15/985,582

(22) Filed: May 21, 2018

(65) Prior Publication Data

US 2019/0355878 A1    Nov. 21, 2019

(51) Int. Cl.
*H01L 33/50*      (2010.01)
*H01L 33/62*      (2010.01)
(Continued)

(52) U.S. Cl.
CPC ........ *H01L 33/502* (2013.01); *H01L 25/0753* (2013.01); *H01L 25/167* (2013.01); *H01L 33/0093* (2020.05); *H01L 33/06* (2013.01); *H01L 33/24* (2013.01); *H01L 33/32* (2013.01); *H01L 33/42* (2013.01); *H01L 33/505* (2013.01);
(Continued)

(58) Field of Classification Search
CPC .... H01L 33/501; H01L 33/502; H01L 33/508
See application file for complete search history.

(56) References Cited

U.S. PATENT DOCUMENTS

2006/0055316 A1*   3/2006   Wu ................... C09K 11/7774
                                                   313/503
2008/0157057 A1*   7/2008   Kim ....................... H01L 33/32
                                                      257/14
(Continued)

FOREIGN PATENT DOCUMENTS

KR    10-2017-0101065    9/2017
WO    WO 2017-111827    6/2017

OTHER PUBLICATIONS

International Preliminary Report on Patentability for International Patent Application No. PCT/US2019/027032, dated Dec. 3, 2020, 10 pages.
(Continued)

*Primary Examiner* — John A Bodnar
(74) *Attorney, Agent, or Firm* — Schwabe, Williamson & Wyatt, P.C.

(57) ABSTRACT

Micro light-emitting diode displays having nanophosphors, and methods of fabricating micro light-emitting diode displays having nanophosphors, are described. In an example, a pixel structure includes a substrate having a plurality of conductive interconnect structures in a first dielectric layer thereon. A plurality of micro light emitting diode devices is in a second dielectric layer above the first dielectric layer, including a first blue micro light emitting diode device, a second blue micro light emitting diode device, and a green micro light emitting diode device. A transparent conducting oxide layer is disposed on the plurality of micro light emitting diode devices and on the second dielectric layer. A phosphor layer is on the transparent conducting oxide layer (Continued)

at a location vertically aligned with the first blue micro light emitting diode device but not at a location vertically aligned with the second blue micro light emitting diode device.

15 Claims, 15 Drawing Sheets

(51) Int. Cl.
| | |
|---|---|
| *H01L 25/075* | (2006.01) |
| *H01L 25/16* | (2006.01) |
| *H01L 33/42* | (2010.01) |
| *H01L 33/32* | (2010.01) |
| *H01L 33/06* | (2010.01) |
| *H01L 33/00* | (2010.01) |
| *H01L 33/24* | (2010.01) |
| *H01L 27/12* | (2006.01) |

(52) U.S. Cl.
CPC ............ *H01L 33/62* (2013.01); *H01L 27/124* (2013.01); *H01L 2933/0016* (2013.01); *H01L 2933/0041* (2013.01); *H01L 2933/0066* (2013.01)

(56) References Cited

U.S. PATENT DOCUMENTS

| | | |
|---|---|---|
| 2008/0185604 A1 | 8/2008 | Kim |
| 2008/0191218 A1* | 8/2008 | Kalem ............ H01L 21/28211 |
| | | 257/734 |
| 2010/0140641 A1* | 6/2010 | Kinomoto ............ G02B 6/0073 |
| | | 257/98 |
| 2017/0025399 A1 | 1/2017 | Takeya et al. |
| 2017/0037308 A1* | 2/2017 | Römer ................. H01L 33/507 |
| 2017/0250316 A1 | 8/2017 | Yeon et al. |
| 2017/0358562 A1* | 12/2017 | Banna ..................... H01L 25/50 |

OTHER PUBLICATIONS

International Search Report and Written Opinion for International Patent Application No. PCT/US2019/027032, dated Aug. 2, 2019, 13 pages.

"Complete composition tunability of InGaN nanowires using a combinatorial approach", nature materials, vol. 6, Dec. 2007 www.nature.com/naturematerials, Published online: Oct. 28, 2007; doi:10.1038/nmat2037.

* cited by examiner ical field.

MICRO LIGHT-EMITTING DIODE DISPLAYS HAVING NANOPHOSPHORS

TECHNICAL FIELD

Embodiments of the disclosure are in the field of micro-LED devices and, in particular, micro light-emitting diode displays having nanophosphors, and methods of fabricating micro light-emitting diode displays having nanophosphors.

BACKGROUND

Displays having micro-scale light-emitting diodes (LEDs) are known as micro-LED, mLED, and μLED. As the name implies, micro-LED displays have arrays of micro-LEDs forming the individual pixel elements.

A pixel may be a minute area of illumination on a display screen, one of many from which an image is composed. In other words, pixels may be small discrete elements that together constitute an image as on a display. These primarily square or rectangular-shaped units may be the smallest item of information in an image. Pixels are normally arranged in a two-dimensional (2D) matrix, and are represented using dots, squares, rectangles, or other shapes. Pixels may be the basic building blocks of a display or digital image and with geometric coordinates.

DESCRIPTION OF THE EMBODIMENTS

Figure 1:
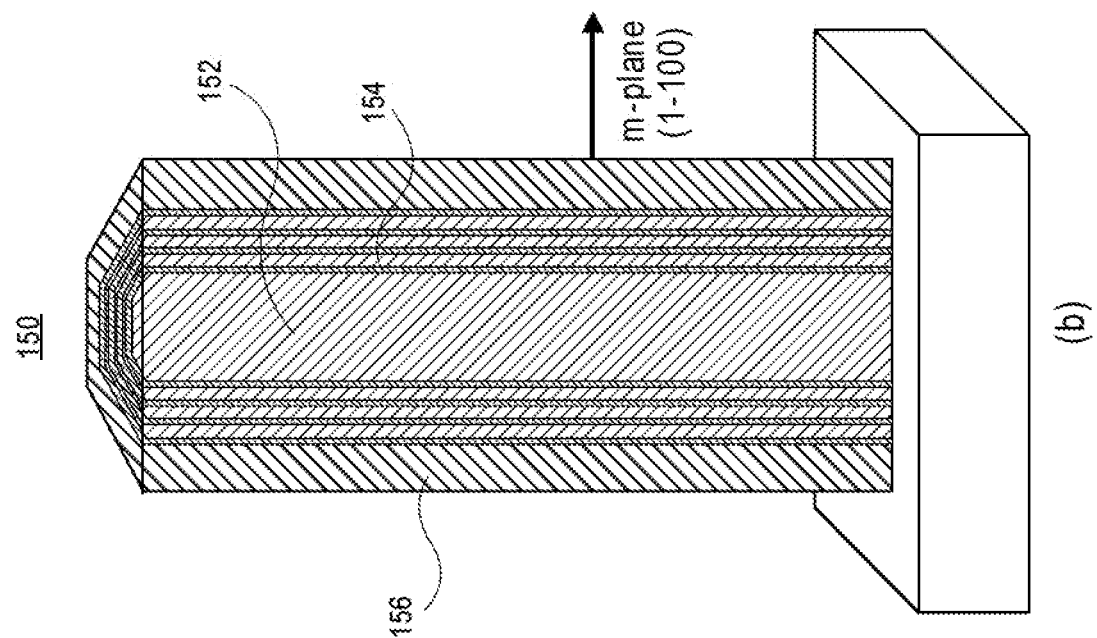
FIG. 1 is a schematic of (a) a c-plane oriented and (b) an m-plane oriented multiple quantum well (MQW) nanowire.
Figure 1:
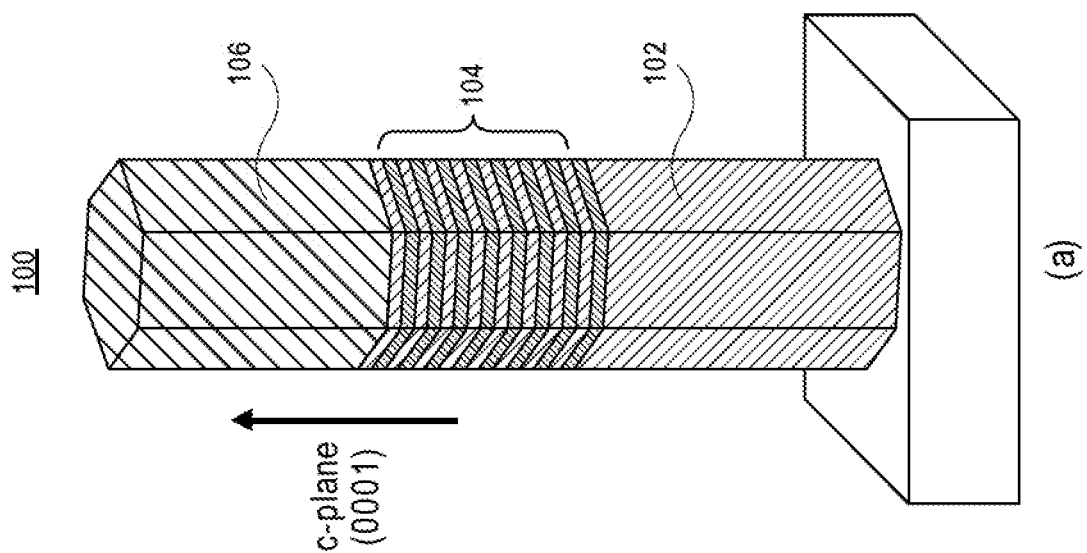

Micro light-emitting diode displays having nanophosphors, and methods of fabricating micro light-emitting diode displays having nanophosphors, are described. In the following description, numerous specific details are set forth, such as specific material and structural regimes, in order to provide a thorough understanding of embodiments of the present disclosure. It will be apparent to one skilled in the art that embodiments of the present disclosure may be practiced without these specific details. In other instances, well-known features, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

One or more embodiments described herein are directed to devices and architectures for micro LED displays. To provide context, displays based on inorganic micro LEDs (μLEDs) have attracted increasing attention for applications in emerging portable electronics and wearable computers such as head-mounted displays and wristwatches. Micro LEDs are typically first manufactured on Sapphire or silicon wafers (for example) and then transferred onto a display backplane glass substrate upon which active matrix thin-film transistors have been manufactured.

Micro LED displays promise 3×-5× less power compared to organic LED (OLED) displays. The difference may result in a savings in battery life in mobile devices (e.g., notebook and converged mobility) and can enhance user experience. In an embodiment, micro LED displays described herein consume two-fold less power compared to organic LED (OLED) displays. Such a reduction in power consumption may provide an additional approximately 8 hours of battery life. Such a platform may even outperform platforms based on low power consumption central processing units (CPUs). Embodiments described herein may be associated with one or more advantages such as, but not limited to, high manufacturing yield, high manufacturing throughput (display per hour), and applicability for displays with a diagonal dimension ranging from 2 inches to 15.6 inches.

In accordance with embodiments of the present disclosure, devices and methods for fabricating micro LED displays using InGaN nanophosphors are described. To provide context, it is to be appreciated that approaches for fabricating a micro LED may include the use of red, green and blue micro LEDs fabricated from gallium nitride (GaN). However, such an approach may exhibit high power consumption due to inefficient red GaN micro LEDs.

To provide further context, displays based on inorganic micro LEDs (µLEDs) have attracted increasing attention for applications in portable electronics such as notebook personal computers (PCs). Notebook PCs with micro LED displays promise 50% more battery lifetime compared to Notebook PCs with organic LED displays (OLEDs). It is to be appreciated that one key to realizing the promised power reductions with micro LED displays is the fabrication of LEDs with high power efficacies for the three color (red, green, and blue) LED emitters. Currently, however, the efficiency of red LEDs is around 10× lower than desired. Addressing such issues, in accordance with an embodiment of the present disclosure, device structures and approaches for manufacturing high performance solid-state semiconductor device are described.

As a comparison, state-of-the-art approaches to addressing the above issues include (1) fabricating an array of nanowires with InGaN/GaN multi-quantum well shells that have different indium composition for different colors (e.g., 20% for blue, 30% for green, and 40% for red) or (2) fabricating an array of nanowires with InGaN/GaN multi-quantum well shells that have indium composition to emit blue light, coated with InP-based quantum dots that convert blue light to red or green lights.

As an example of the nanowires described in (1) or (2) above, FIG. 1 is a schematic of (a) a c-plane oriented and (b) an m-plane oriented multiple quantum well (MQW) nanowire. Referring to part (a) of FIG. 1, a nanowire 100 is fabricated on a Si(111) substrate. The nanowire includes an n-GaN lower layer 102, an InGaN/GaN multi-quantum well (MQW) stack 104 on the n-GaN lower layer 102, and an upper p-GaN layer on the InGaN/GaN multi-quantum well (MQW) stack 104. Referring to part (b) of FIG. 1, a nanowire 150 is fabricated on a Si(111) substrate. The nanowire includes an n-GaN inner layer 152, an InGaN/GaN multi-quantum well (MQW) stack 154 on the n-GaN inner layer 152, and an outer p-GaN layer on the InGaN/GaN multi-quantum well (MQW) stack 154.

Disadvantages of using the above approaches include, for state-of-the-art approach (1), challenges in realizing efficient red micro LEDs. For state-of-the-art approach (2) reliability of quantum dots (QDs) is not yet proven, and efficiency of green QDs is approximately 2× smaller than desired.

By contrast, one or more embodiments of the present disclosure provide a light emitting device employing red and green InGaN phosphors that can be readily prepared to have high purity. One or more embodiments of the present disclosure provide a light emitting device employing red and green InGaN phosphors capable of reducing light loss due to non-radiative recombination. One or more embodiments of the present disclosure provide a micro LED display with low power and long lifetime via the use of InGaN nanophosphors that are mixed in photoresist or other type of ink and patterned on top of blue nanowire LEDs.

A light emitting device according to an embodiment of the present disclosure includes a light emitting diode for emitting light having a first wavelength with a main peak in blue wavelength range. InGaN nanowire phosphors are combined with the light emitting diode for converting at least a portion of light having the first wavelength emitted from the light emitting diode into light with a second wavelength longer than the first wavelength (e.g., green or red). The InGaN nanowire phosphors can reduce the number of traps as compared with conventional phosphors or InP-based quantum dots, resulting in reduction of light loss due to non-radiative recombination. Advantages of implementing one or more of the embodiments described herein may include one or more of (1) low manufacturing cost, (2) low power displays and/or (3) long lifetime displays.

It is to be appreciated that demand for low power in consumer electronic devices has increased dramatically in the past ten years due to limited battery lifespan. One of the components with the highest percentage of total energy consumption, and therefore a suitable candidate for improvement, is the display. The developments of low power displays are becoming a high priority for the consumer electronics industry. Micro LED (µLED) display is a type of emissive display technology that uses a matrix of individually-switched self-illuminating inorganic diodes that can be controlled and lit without a master backlight. Inorganic µLEDs have a number of potential advantages over organic LEDs (OLEDs) for display applications including high brightness, longer lifecycle, and imperviousness to image sticking and burn in. Typically, in µLED displays, a desired color and luminance value are created from various combinations of three colors of light emitting elements (red, green and blue).

It is to be appreciated that due to the inorganic nature of the emitting materials of micro LEDs versus OLEDs, the efficiency and narrow emission bands of µLEDs also offer the prospect of significantly improved performance in terms of: energy consumption, color gamut, brightness, contrast (High Dynamic Range), long lifetime and environmental stability (not sensitive to air, moisture), and compatibility with flexible backplane technologies to enable curved or flexible displays. In addition, µLEDs can deliver extremely high pixel density (up to 5000 PPI) which, along with very high brightness, make them ideal for numerous applications such as displays for laptop computers, portable devices, Augmented Reality (AR), and/or Head Up Display projectors.

Figure 2:
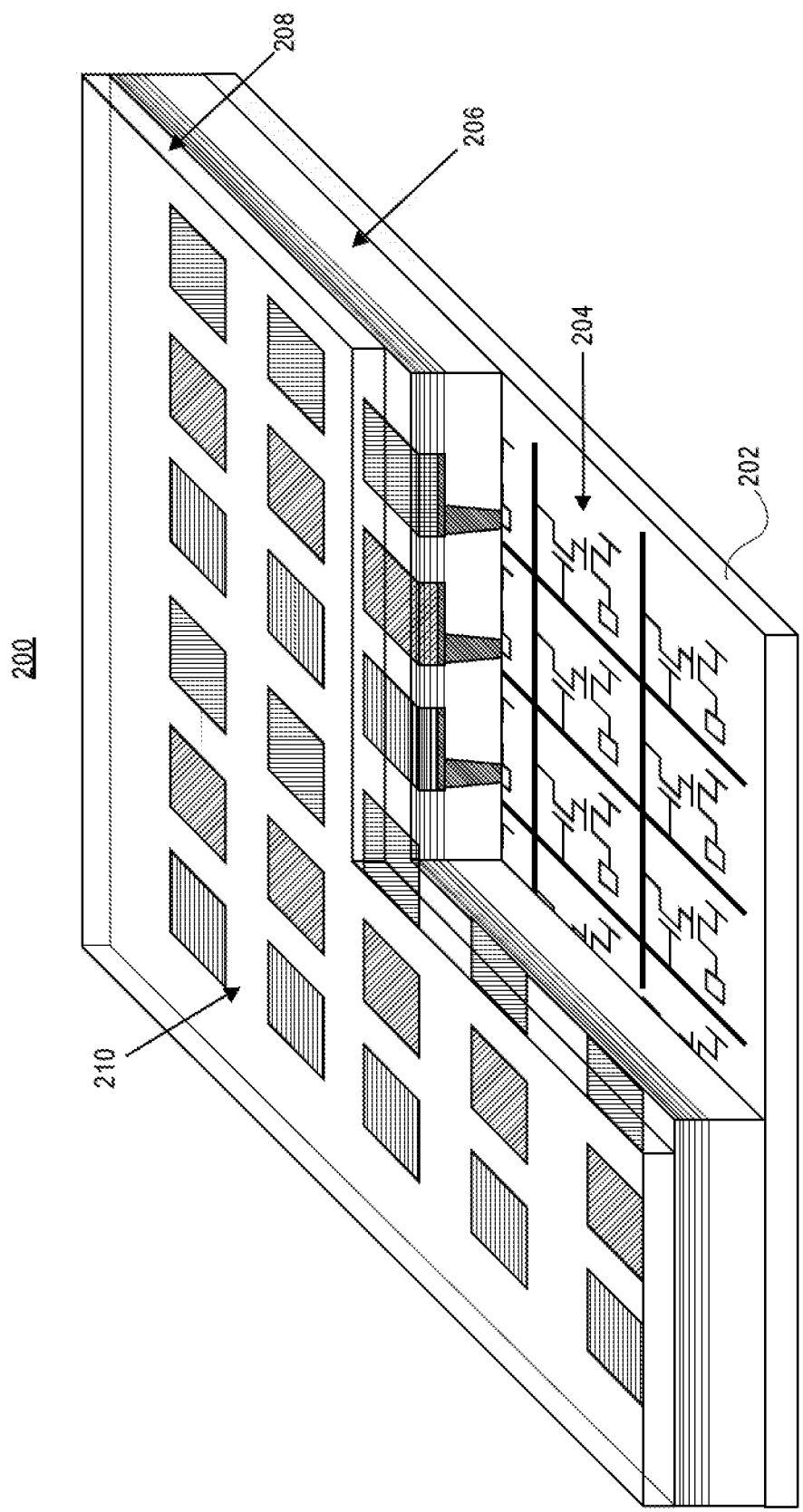
FIG. 2 illustrates a schematic of micro LED display architecture, in accordance with an embodiment of the present disclosure.

One or more embodiments are directed to approaches and devices for enabling the fabrication of full-color micro light emitting diode (µLED) displays. As an exemplary display architecture, FIG. 2 illustrates a schematic of micro LED display architecture, in accordance with an embodiment of the present disclosure. Referring to FIG. 2, a micro LED display 200 includes a backplane 202 having pixel circuits 204 thereon, such as thin film transistor (TFT) circuits. An insulator 206 is over the pixel circuits 204. Micro LED layers 208 are included over the insulator 206. A transparent electrode 210 is over the micro LED layers 208. A significant component of the micro LED ecosystem is the TFT backplane supply. Embodiments described herein may be implemented to address improvements in TFT backplanes.

In an embodiment, a micro LED has a dimension of approximately 5 µm×5 µm and is composed of multiple nanowires connected in parallel. In one embodiment, nanowires are grown on Si wafers using a mask with openings with diameters ranging between 80 nm to 250 nm. Smallest diameter nanowires emit blue color, and largest diameter nanowires emit red color. There are several device structures for each nanoemitter (e.g., nanowire, nanopyramid). FIGS. 3A-3D illustrate several options for micro LED structures.

Figure 3A:
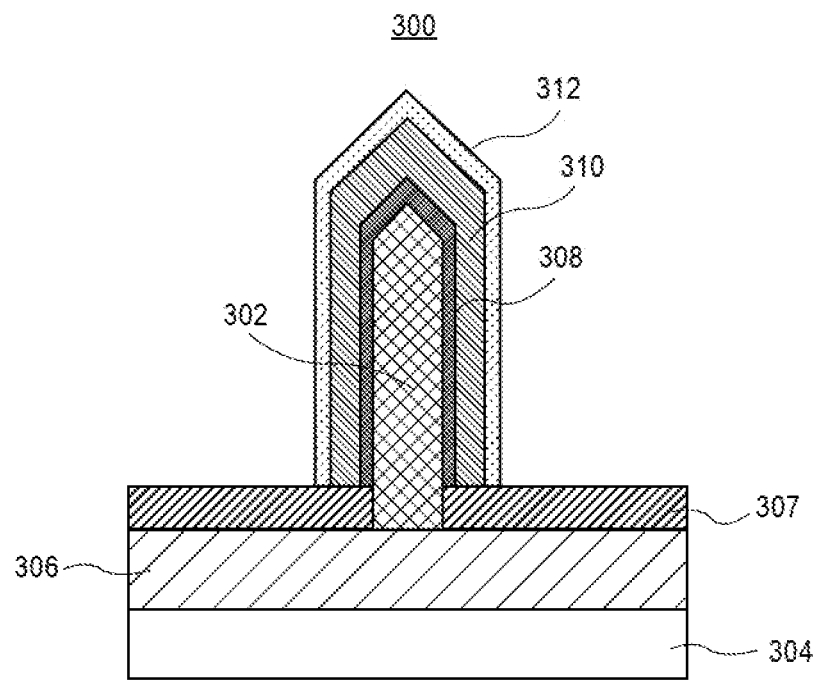
FIG. 3A illustrates a cross-sectional view of a GaN nanowire based LED highlighting certain layers of the LED, in accordance with an embodiment of the present disclosure.

In a first example, FIG. 3A illustrates a cross-sectional view of a GaN nanowire based LED highlighting certain layers of the LED, in accordance with an embodiment of the present disclosure. In the exemplary embodiment of FIG. 3A, an LED 300 includes an n-type GaN nanowire 302. The GaN nanowire 302 is above a substrate 304, which may be a Si(001) substrate. An intervening nucleation layer 306 has an opened mask layer 307 thereon. In one embodiment, the nucleation layer is an AlN layer. In another embodiment, the nucleation layer 306 is an MN/AlN nucleation layer with MN=transition metal nitride, and where the metal can be Ti, Hf, Nb, etc. In another embodiment, the nucleation layer is a graphene layer. In one embodiment, the n-type GaN nanowire 302 has a diameter in the range of 100-200 nanometers, and a height in the range of 1-10 microns. An active layer 308 of InGaN is on the n-type GaN nanowire 302. A p-GaN cladding layer 310 is included on the active layer 308. A conductive electrode layer 312 may be formed on the p-GaN cladding layer 310, as is depicted.

Figure 3B:
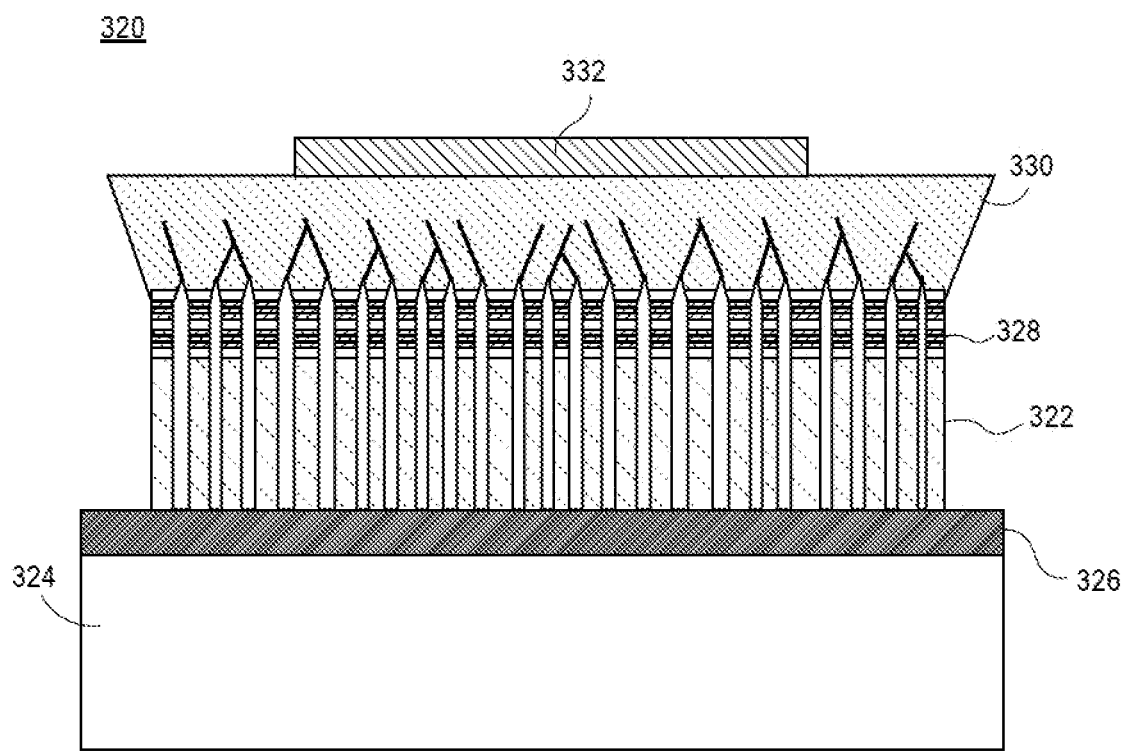
FIG. 3B illustrates a cross-sectional view of a micro-LED composed of multiple nanowire LEDs, in accordance with an embodiment of the present disclosure.

In a second example, FIG. 3B illustrates a cross-sectional view of a micro-LED composed of multiple nanowire LEDs, in accordance with an embodiment of the present disclosure. In the exemplary embodiment of FIG. 3B, a micro-LED 320 includes an n-GaN nano-column 322 above a substrate 324, which may be an n-type Si(111) substrate. An intervening nucleation layer 326, such as an AlN layer, or MN/AlN stack, or graphene layer, is included between the n-GaN nano-column 322 and the substrate 324 or, alternatively, the nucleation layer 326 may be omitted. An InGaN/GaN multi-quantum well device (MQD) stack 328 is included on the n-GaN nano-column 322. A p-GaN layer 330 is on the multi-quantum well device (MQD) stack 328. A transparent p-electrode 332 is included on the p-GaN layer 330.

It is to be appreciated that foundational geometries other than the above described nanowires may be used for LED fabrication. In a third example, in another embodiment, FIG. 3C illustrates a cross-sectional view of a nanopyramid or micropyramid based LED highlighting certain layers of the LED, in accordance with an embodiment of the present disclosure. In the exemplary embodiment of FIG. 3C, an LED 340 includes an n-GaN nanopyramid 342 above a substrate 344, which may be a Si(111) substrate. An intervening nucleation layer 346, such as described for FIG. 3A, has an opened mask layer 347 thereon. An active layer 348, such as described for FIG. 3A, is included on the n-GaN nanopyramid 342. A p-type cladding layer 352, such as described for FIG. 3A, is included on the active layer 348. It is to be appreciated that a micro LED may be composed of multiple nanopyramids connected in parallel. For example, a 5 micron×5 micron micro LED may be composed of, e.g., 20 nanopyramids.

Figure 3D:
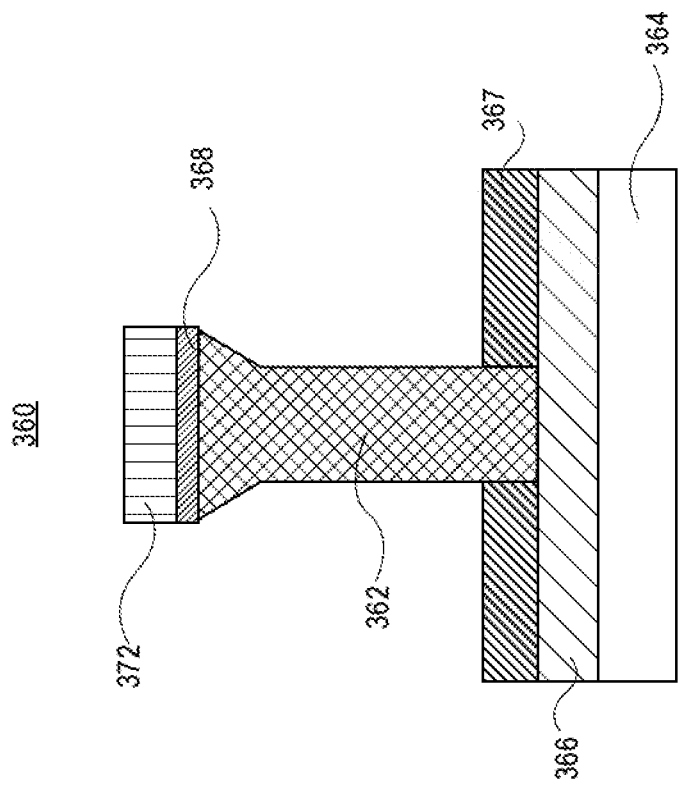
FIG. 3D illustrates a cross-sectional view of an axial nanowire based LED highlighting certain layers of the LED, in accordance with an embodiment of the present disclosure.
Figure 3C:
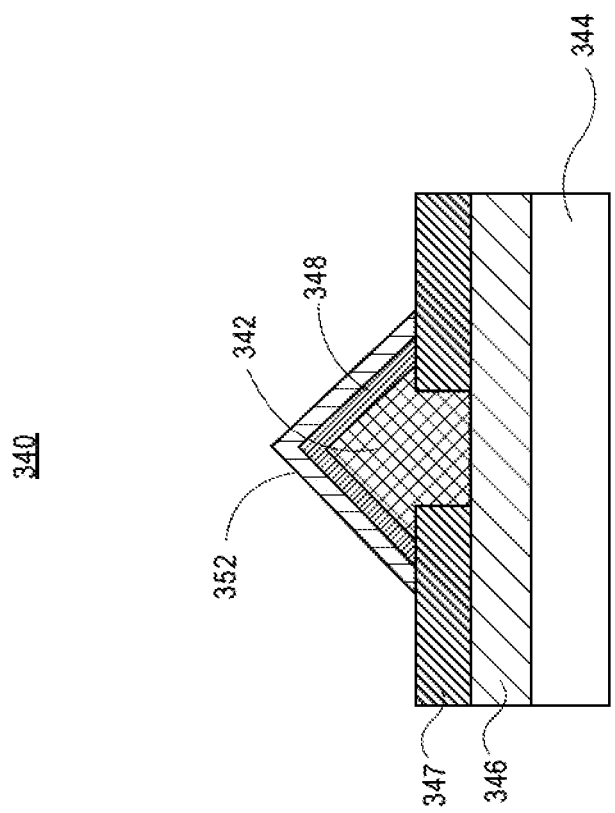
FIG. 3C illustrates a cross-sectional view of a nanopyramid or micropyramid based LED highlighting certain layers of the LED, in accordance with an embodiment of the present disclosure.

In a fourth embodiment, FIG. 3D illustrates a cross-sectional view of an axial nanowire based LED highlighting certain layers of the LED, in accordance with an embodiment of the present disclosure. In the exemplary embodiment of FIG. 3D, an LED 360 includes an n-GaN axial nanowire 362 above a substrate 364, which may be a Si(111) substrate. An intervening active layer 366, such as described for FIG. 3A, has an opened mask layer 367 thereon. An active layer 368, such as described for FIG. 3A, is included on the n-GaN axial nanowire 362. A p-type cladding layer 372, such as described for FIG. 3A, is included on the active layer 368.

In an embodiment, a strategy for manufacturing displays includes first growing monolithic blue and green GaN-based nanowire LEDs on 200 mm or 300 mm silicon wafers. Then, a tool is used to transfer the nanowire LEDs from wafers to display backplanes using a so called "Direct Transfer Method" or DTM. In DTM, monolithic RGB LEDs are required to be grown on the same substrate. Direct transfer of such RGB LED pixels from wafer to display backplanes is performed using a modified wafer-to-wafer bonding tool.

Figure 4:
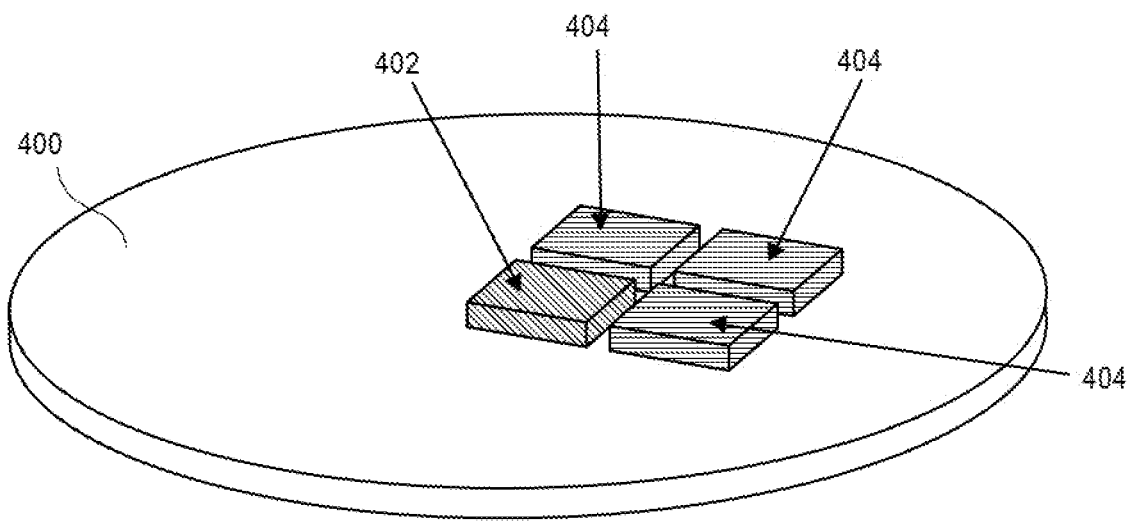
FIG. 4 illustrates an angled schematic of a silicon wafer having one representative "pixel" thereon, in accordance with an embodiment of the present disclosure.

FIG. 4 illustrates an angled schematic of a silicon wafer having one representative "pixel" thereon, in accordance with an embodiment of the present disclosure. Referring to FIG. 4, silicon wafer 400 has a foundational pixel thereon including green 402 and blue 404 µLEDs grown monolithically thereon. One or two of the three blue 404 µLEDs may subsequently be associated with a red phosphor layer to ultimately provide RGB colors.

A micro transfer apparatus may be used to bond monolithic RGB micro LED pixels to a display backplane using a direct transfer method (DTM). In an example, FIG. 5 illustrates a cross-sectional view of a schematic of a display bonder apparatus, in accordance with an embodiment of the present disclosure.

Figure 5:
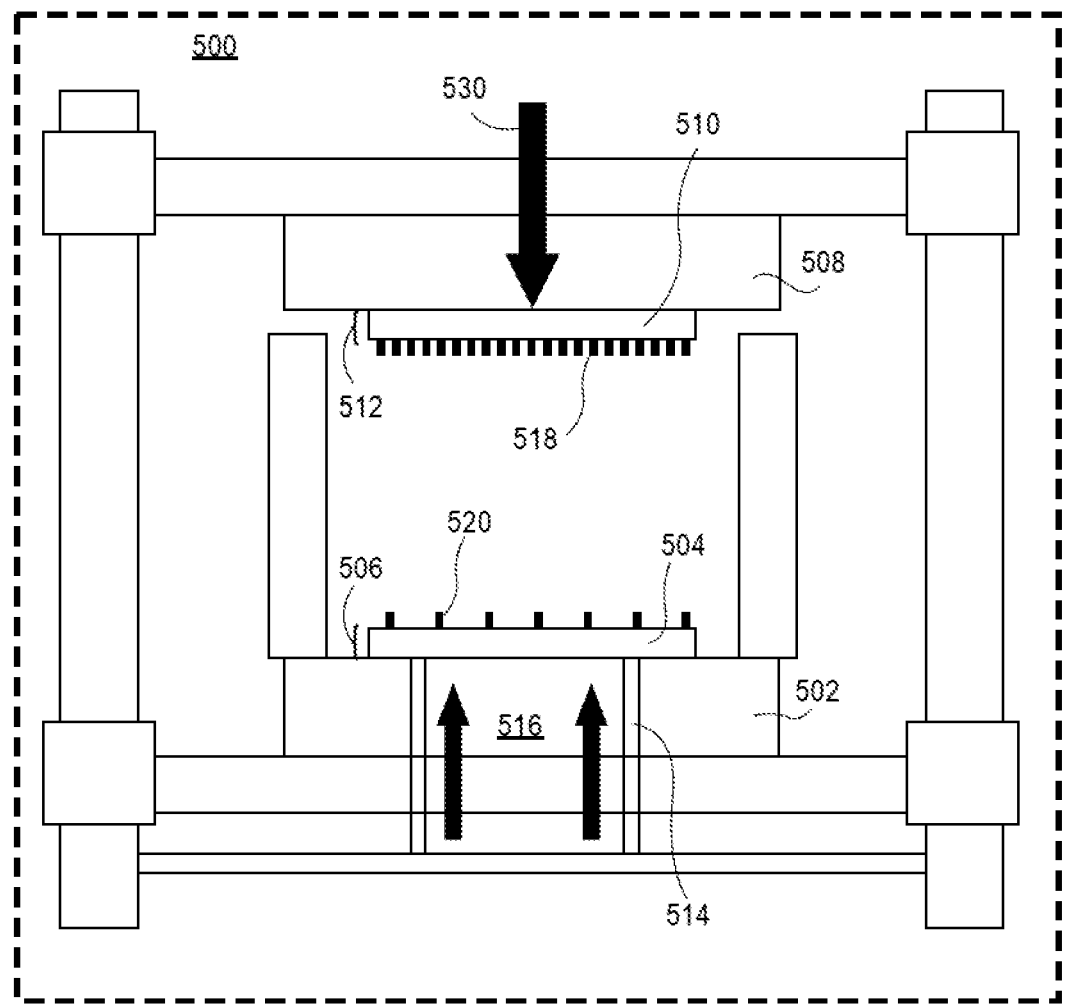
FIG. 5 illustrates a cross-sectional view of a schematic of a display bonder apparatus, in accordance with an embodiment of the present disclosure.

Referring to FIG. 5, a display bonder apparatus 500 includes a first support 502 for holding a display backplane substrate 504 in a first position 506. A second support 508 is for holding a donor wafer 510 such as a silicon growth wafer in a second position 512. The second position 512 is over the first position 506. In one embodiment, a piston 514 is coupled to the first support 502. The piston 514 is for moving the display backplane substrate 504 from the first position 506 toward the second position 512. Further, the piston 514 applies a force 516 to the display backplane substrate 504 to bond light-emitting diode (LED) pixel elements 518 on the donor wafer 510 to metal bumps 520 on the display backplane substrate 504. In an embodiment, the display bonder apparatus further includes an infra-red (IR) light source 530 coupled to the second support 508. The IR light source 530 may be used to release LED pixel elements 518 from the donor wafer 510.

In an embodiment, the display bonder apparatus 500 is used in a transfer process where a micro LED source wafer (e.g., silicon growth or mother source wafer) is brought into contact with a display substrate having metal bumps, such that the micro LED metal contacts and backplane metal bumps are opposite to one another. The bonding process involves orienting the two substrates (source wafer and display substrate) parallel to one another and compressing the two substrates together by applying force 516 on the outer surface of the display substrate. The force 516 may be applied to the center of the display substrate with a piston-type mechanism. The bonder apparatus 500 may provide precise bonding and may be suitable for bonding one substrate pair at a time. The bonding apparatus may be provided with a vacuum chamber (or any controlled atmosphere) and an aligner. The substrates may be aligned in the aligner, loaded in the controlled atmospheric chamber (vacuum/other), and thereafter bonded to each other.

In one aspect, a display assembly method involves fabricating micro LED structures on silicon wafers. In an embodiment, a manufacturing approach involves first providing two types of wafers. A first wafer includes µLED arrays with a very small pitch (e.g., less than 5 µm) fabricated on, e.g., 300 mm silicon wafers. In an example, green and blue LEDs are manufactured monolithically. In one embodiment, the LED active layers are composed of Indium Gallium Nitride (InGaN) with different Indium composition corresponding to different colors (e.g., blue color LEDs have approximately 20% indium, and green color LEDs have approximately 30% indium).

A second wafer, such as a 300 mm wafer, is prepared with driver circuit arrays (e.g., corresponding to the μLED arrays mentioned above). The driver circuit arrays may be fabricated to include CMOS devices on silicon wafers (e.g., 22 nm node, 32 nm node, 45 nm node, 65 nm node, 90 nm node, 130 nm node, or 180 nm node). Wafer-to-wafer bonding is then performed to couple the above two wafers using wafer bonding technology with an alignment accuracy of, e.g., ±0.5 μm or better.

Figure 6:
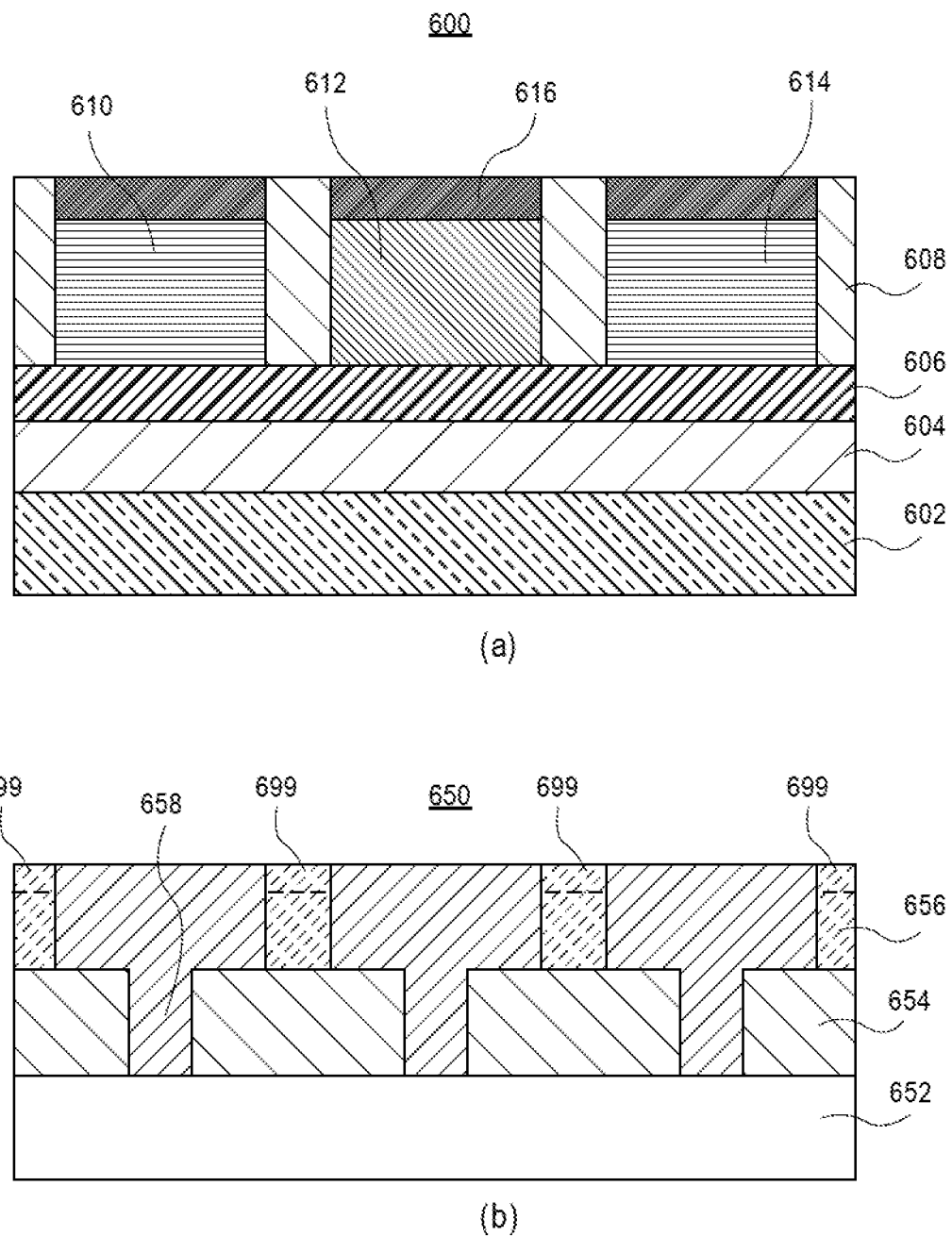
FIGS. 6-8 illustrate cross-sectional views representing various operations in a method of fabricating a micro light emitting diode pixel structure, in accordance with an embodiment of the present disclosure.
Figure 7:
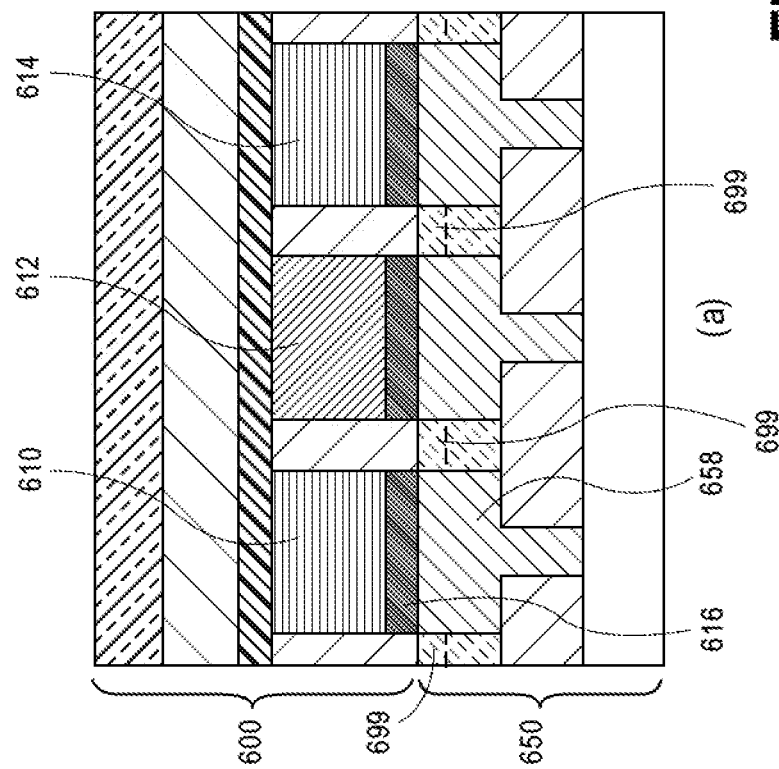
Figure 8:
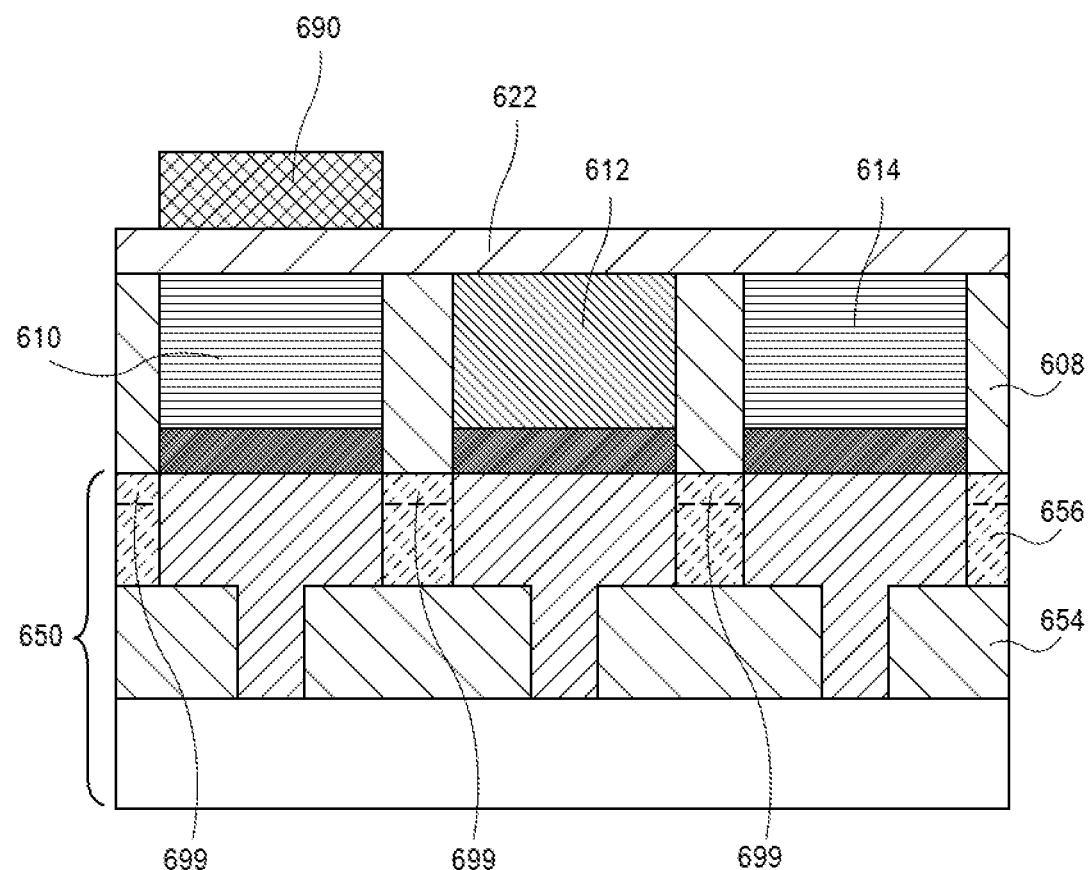

As an example, FIGS. 6-8 illustrate cross-sectional views representing various operations in a method of fabricating a micro light emitting diode pixel structure, such as a display for use in a display for a laptop or other portable computer, in accordance with an embodiment of the present disclosure.

Referring to part (a) of FIG. 6, structure 600 includes a second wafer 602, such as silicon wafer having an aluminum nitride (AlN) 604 and nucleation layer 606 thereon (e.g., MN, as described above). Wafer 602 includes a plurality of micro light emitting diode devices 610/612/614 in a dielectric layer 608 thereon. In one embodiment, the plurality of micro light emitting diode devices includes a first blue micro light emitting diode device 610, a green micro light emitting diode device 612, and a second blue micro light emitting diode device 614. A metal layer 616, such as a copper layer, may be included as an anode layer, as is depicted. In an embodiment, each color LED is composed of nanowires. In a particular such embodiment, nanowires for green micro LEDs have diameters of approximately 140 nm, and nanowires for blue micro LED have diameters of approximately 80 nm.

Referring to part (b) of FIG. 6, structure 650 includes a first wafer 652 having a plurality of conductive interconnect structures 658 in a first dielectric layer 654/656 thereon. In one embodiment, first dielectric layer 654/656 includes a first low-k portion 654 and a second different low-k portion 656, as is depicted. Alternatively, first low-k portion 654 second low-k portion 656 may be a same layer. In one embodiment, the first wafer 652 is a silicon substrate including metal oxide semiconductor (CMOS) devices or thin film transistor (TFT) devices coupled to the plurality of conductive interconnect structures 658. In one embodiment, second different low-k portion 656 is co-planar with conductive interconnect structures 658, as is depicted. In another embodiment, second different low-k portion 656 is recessed relative to conductive interconnect structures 658, e.g., recessed to level 699.

Referring to part (a) of FIG. 7, structures 600 and 650, i.e., first and second wafers, are coupled to provide individual ones of the plurality of micro light emitting diode devices 610/612/614 electrically coupled to a corresponding one of the plurality of conductive interconnect structures 658, e.g., by wafer-to-wafer bonding. The bonding may be through metal layer 616, as is depicted. Referring to part (b) of FIG. 7, the second wafer 602 (and, if included, layers 604 and 606) are removed to expose the plurality of micro light emitting diode devices 610/612/614.

Referring to FIG. 8, a transparent conducting oxide layer 622 is formed on the plurality of micro light emitting diode devices 610/612/614 and on the dielectric layer 608. In an embodiment, a red phosphor layer 690 is formed on the transparent conducting oxide layer 622 at a location vertically aligned with the first blue micro light emitting diode device 610. In one such embodiment, the red phosphor layer 690 includes InGaN based phosphors which may be included in a matrix, such as a photoresist matrix.

Referring again to FIGS. 6-8, a micro light emitting diode pixel structure includes a substrate 652 having a plurality of conductive interconnect structures 658 in a first dielectric layer 654/656 thereon. A plurality of micro light emitting diode devices 610/612/614 is in a second dielectric layer 608 above the first dielectric layer 654/656. Individual ones of the plurality of micro light emitting diode devices 610/612/614 is electrically coupled to a corresponding one of the plurality of conductive interconnect structures 658. The second dielectric layer 608 is separate and distinct from the first dielectric layer 654/656, and may be recessed to form a gap there between. A transparent conducting oxide layer 622 is disposed on the plurality of micro light emitting diode devices 610/612/614 and on the second dielectric layer 608. A phosphor layer 690 is on the transparent conducting oxide layer 622 at a location vertically aligned with one of the micro light emitting diode devices 610/612/614, e.g., vertically aligned with a blue micro light emitting diode device 610. In one such embodiment, phosphor layer 690 is on the transparent conducting oxide layer 622 at a location vertically aligned with the blue micro light emitting diode device 610 but not at a location vertically aligned with the blue micro light emitting diode device 614, as is depicted.

In one embodiment, substrate 652 is a silicon substrate including metal oxide semiconductor (CMOS) devices or thin film transistor (TFT) devices coupled to the plurality of conductive interconnect structures 658. In one embodiment, the plurality of micro light emitting diode devices 610/612/614 includes a first blue micro light emitting diode device 610, a single green micro light emitting diode device 612, and a second blue micro light emitting diode device 614. In one embodiment, the first 654/656 and second 608 dielectric layers are low-k dielectric layers. In one embodiment, the transparent conducting oxide layer 622 is an indium tin oxide (ITO) layer.

Embodiments described herein include approaches for manufacturing InGaN nanophosphors. The term "nanophosphor" as described herein may be used to refer to a structure having a "rod shape" with a diameter less than approximately 100 nm and a length of less than approximately 1000 nm. A nanowire phosphor may be a nanowire of InGaN with different indium compositions to target green and red colors.

In accordance with an embodiment of the present disclosure, nanowire phosphors are formed on a substrate using metal organic chemical vapor deposition (MOCVD) or molecular beam epitaxy (MBE). It is to be appreciated that there is no specific limitation on the substrate and the substrate may be, for example, a silicon (Si) substrate. Thereafter, the nanowire phosphors are separated from the substrate. Thus, the nanowire phosphors can be readily fabricated, resulting in reduction of manufacturing costs. After growth of the nanowires on silicon coated with a thin metal nucleation layer, infrared laser irradiation is applied from the silicon wafer side to release the nanowires from the silicon substrate. In one embodiment, the nanowires are mixed in a photoresist so they may be coated on blue micro LEDs to make red micro LEDs. In one such embodiment, the a photoresist matrix having nanowire phosphors therein is blanket deposited over a plurality of micro LEDs, and then patterned using photolithography to leave the photoresist matrix having the nanowire phosphors over only select ones of the plurality of micro LEDs.

In an embodiment, a nanowire phosphor includes a core nanowire and a nanoshell covering the core nanowire. The nanoshell can prevent non-radiative recombination from being produced on the surface of the core nanowire, such as a core GaN nanowire. In one embodiment, the nanoshell composed of a material with a bandgap larger than that of the core nanowire, such as an InGaN shell for a GaN core. In one embodiment, nanowire phosphors capable of emitting light throughout the entire region of visible light by controlling the indium content of core nanowires can be fabricated.

Figure 9:
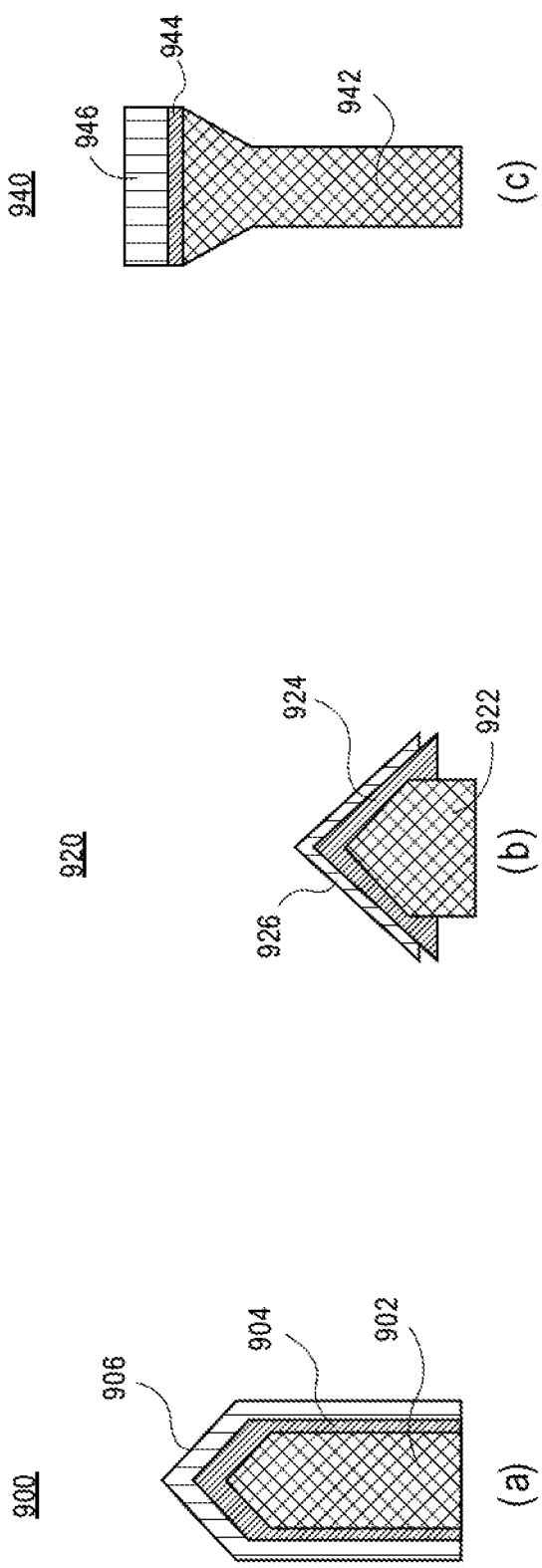
FIG. 9 illustrates several possible geometries of nanophosphor structures, in accordance with an embodiment of the present disclosure.

It is to be appreciated that a variety of nanowire phosphor structures using an InGaN shell active layer that can emit red or green colors upon illumination by blue color may be fabricated. FIG. 9 illustrates several possible geometries of nanophosphor structures, in accordance with an embodiment of the present disclosure.

Referring to part (a) of FIG. 9, a coaxial (core-shell) nanowire-based nanophosphor 900 includes an n-type GaN core 902. An InGaN shell or active layer 904 is on the n-type GaN core 902. An undoped GaN layer 906 is on the InGaN shell or active layer 904.

Referring to part (b) of FIG. 9, a nanopyramid-based nanophosphor 920 includes an n-type GaN core 922. An InGaN shell or active layer 924 is on the n-type GaN core 922. An undoped GaN layer 926 is on the InGaN shell or active layer 924.

Referring to part (c) of FIG. 9, an axial nanowire-based nanophosphor 940 includes an n-type GaN core 942. An InGaN shell or active layer 944 is on the n-type GaN core 942. An undoped GaN layer 946 is on the InGaN shell or active layer 944.

In accordance with a particular embodiment of the present disclosure, a method of manufacturing a nanowire phosphor involves depositing an approximately 50 nm thick aluminum nitride nucleation layer on a silicon wafer, such as an Si(111) wafer. An approximately 20-50 nm thick layer of HfN or TiN or similar transition metal nitride nucleation layer is deposited on the aluminum nitride nucleation layer. An approximately 100-300 nm thick silicon nitride hard mask is then deposited. The silicon nitride hard mask is patterned to have apertures therein, e.g., apertures each having a diameter of less than approximately 100 nm. GaN nanowires are then grown in the apertures, e.g., using MOCVD technology. In one embodiment, the GaN nanowires are grown to have a height of less than approximately 1000 nm. InGaN shells are then grown on the GaN nanowires. In an example, InGaN shells having approximately indium 30% indium composition (e.g., $In_{0.3}Ga_{0.7}N$) are used for green emission, and InGaN shells having approximately indium 41% indium composition are used for red emission. In one embodiment, the shells are grown at relatively low temperature using Nitrogen or Hydrazine as a nitrogen source. Subsequent to forming the nanostructures, infrared laser irradiation may be used to remove the nanostructures from the silicon wafer side, e.g., by ablating the nucleation layer to "release" the nanostructures into a container filled with photoresist. In a particular embodiment, nanophosphor structures are separated from a silicon substrate by ablation of the nucleation layer (e.g., TiN or HfN metals) using infrared laser ablation.

Referring collectively to FIGS. 8 and 9, in accordance with an embodiment of the present disclosure, a phosphor layer for converting blue light from a micro light emitting diode device to red light includes a matrix. A plurality of InGaN-based phosphors in the matrix. Each of the plurality of InGaN-based phosphors includes a GaN core and an InGaN shell on the GaN core.

In one embodiment, each of the plurality of InGaN-based phosphors includes a GaN core and an InGaN shell on the GaN core. In a specific such embodiment, the GaN core includes a structure selected from the group consisting of a nanowire structure, a nanopyramid structure, and an axial nanowire structure. In one embodiment, the matrix is a photoresist matrix.

Figure 10:
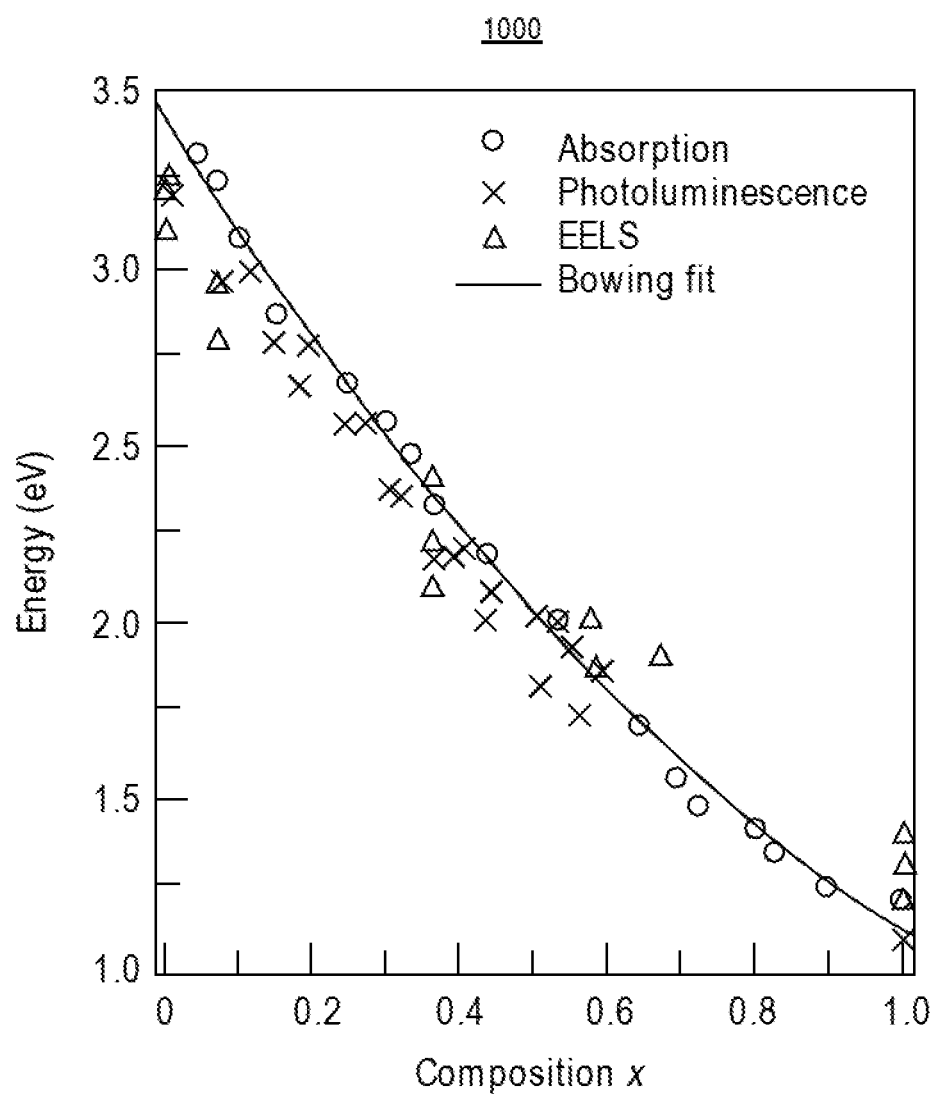
FIG. 10 is a plot of measured energy gap (in eV) for InGaN nanowires as a function of indium composition, in accordance with an embodiment of the present disclosure.

In another aspect, InGaN nanowires with varying indium composition can be used to cover the range of the visible spectrum. FIG. 10 is a plot 1000 of measured energy gap (in eV) for InGaN nanowires as a function of indium composition, in accordance with an embodiment of the present disclosure. As shown in plat 1000, the energy gap can be tuned to cover the entire visible range. In an embodiment, it is feasible to grow InGaN nanowires with a composition from 0% to 100% suitable to cover the entire visible range.

Figure 11:
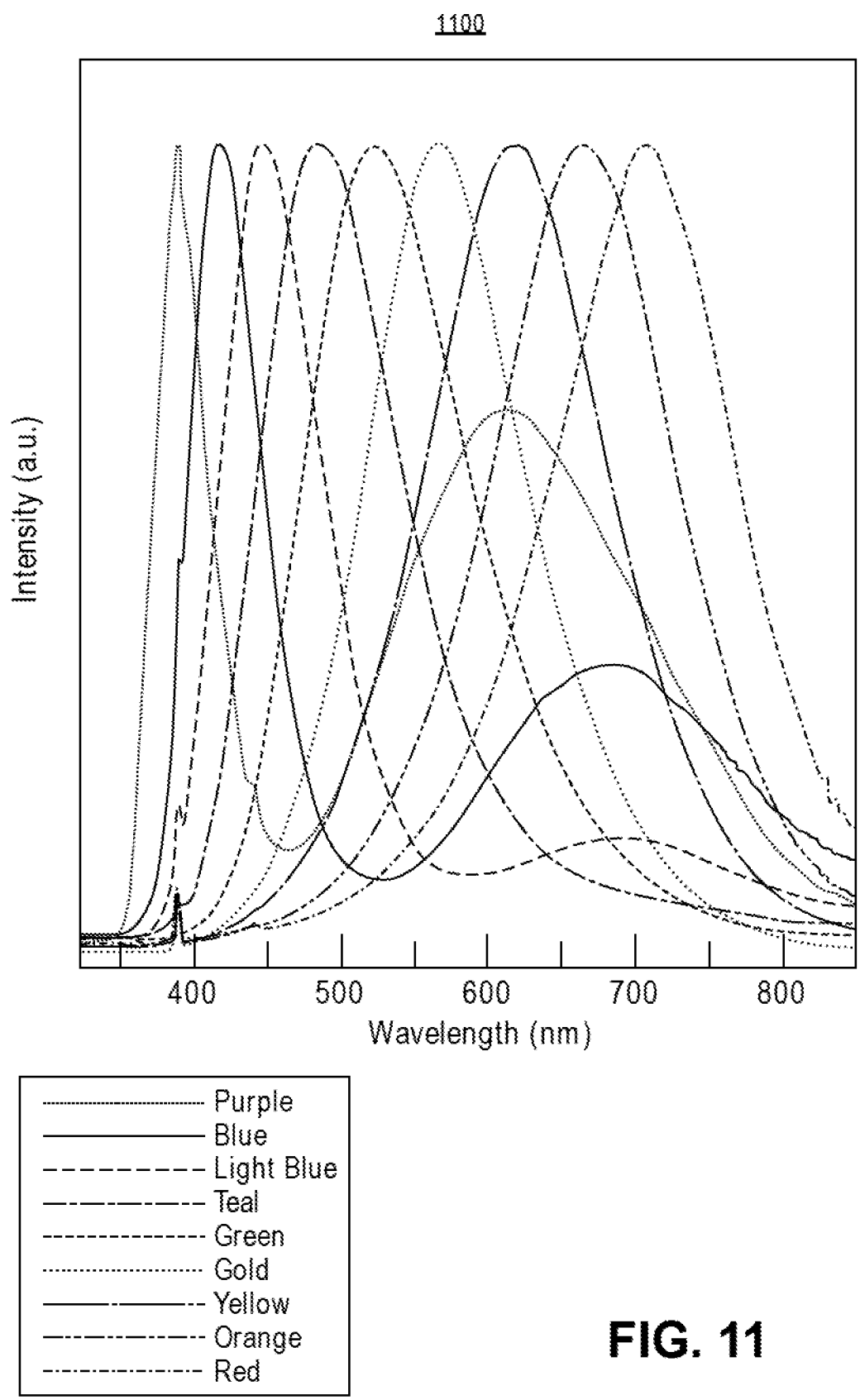
FIG. 11 is a plot and corresponding legend of measured photoluminscence (PL) spectra as intensity (in atomic units, a.u.) for InGaN nanowires as a function of wavelength, in accordance with an embodiment of the present disclosure.

FIG. 11 is a plot 1100 and corresponding legend of measured photoluminscence (PL) spectra as intensity (in atomic units, a.u.) for InGaN nanowires as a function of wavelength, in accordance with an embodiment of the present disclosure. Referring to plot 1100, InGaN nanowires with varying indium compositions demonstrate the feasibility of emitting colors in the entire visible range.

Figure 12:
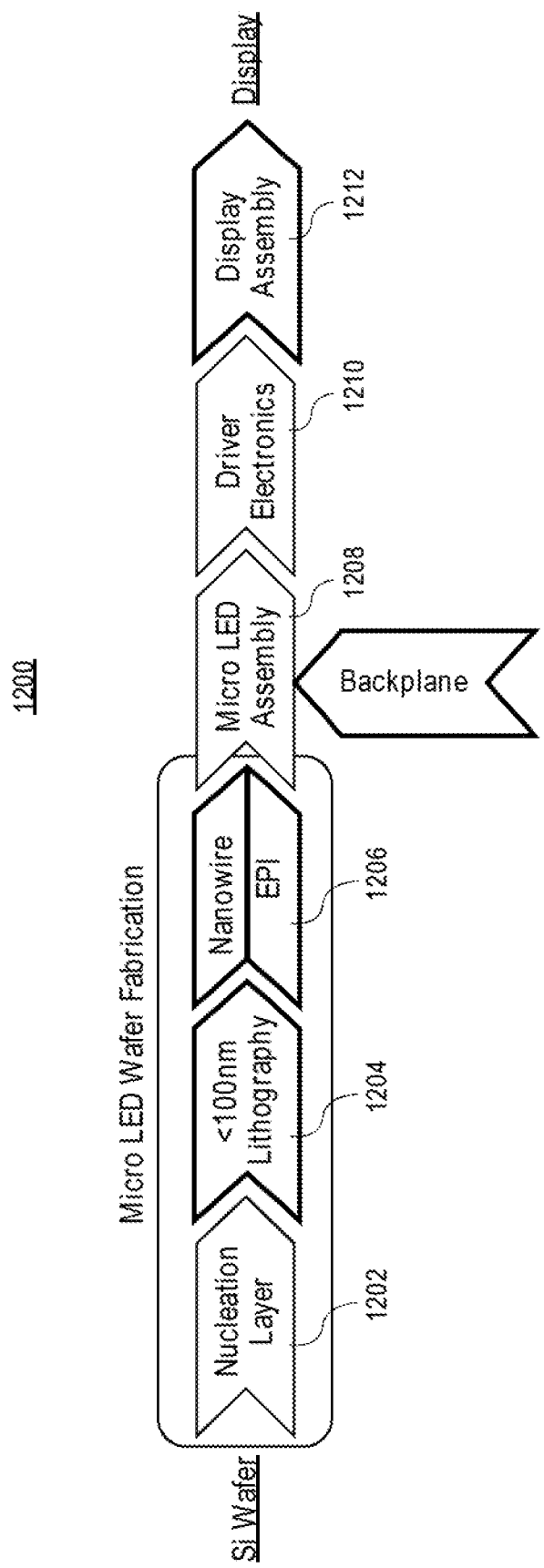
FIG. 12 is a flow diagram illustrating an RGB display production process, in accordance with an embodiment of the present disclosure.

In another aspect, FIG. 12 is a flow diagram 1200 illustrating an RGB display production process, in accordance with an embodiment of the present disclosure. Referring to flow diagram 1200, at operation 1202, a silicon (Si) wafer has a nucleation layer formed thereon, such as a patterned conductive/dielectric nucleation layer. At operation 1204, sub 100 nm lithography is used to pattern a layer on the nucleation layer, or to pattern the nucleation layer. At operation 1206, nanowire growth is performed on the nucleation layer, e.g., by epitaxial deposition. At operation 1208, a backplane is introduced into the micro LED assembly process. At operation 1210, driver electronics are fabricated. At operation 1212, display assembly is performed to finally provide a display.

Figure 13:
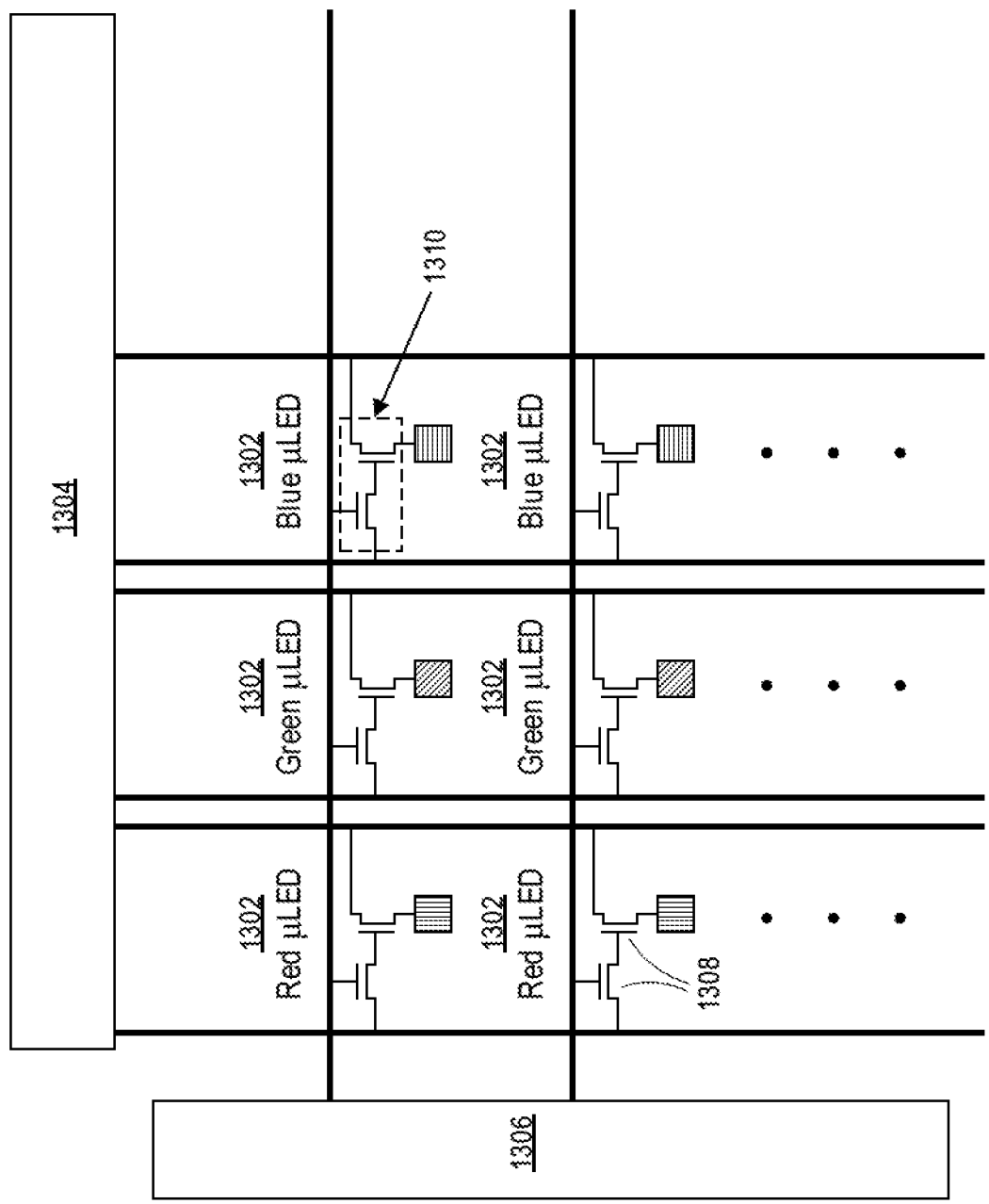
FIG. 13 is a schematic illustration of a display architecture, in accordance with an embodiment of the present disclosure.

FIG. 13 is a schematic illustration of a display architecture, in accordance with an embodiment of the present disclosure. Referring to FIG. 13, micro LEDs 1302 are arranged in a matrix. The micro LEDs are driven through "Data Driver" 1304 and "Scan Driver" 1306 chips. Thin film transistors 1308 are used to make "pixel driver circuits" 1310 for each micro LED. In an embodiment, the micro LEDs are fabricated on a silicon wafer then transferred to a glass substrate called "backplane" where the "pixel driver circuits" 1310 have been fabricated using thin film transistors.

Figure 14:
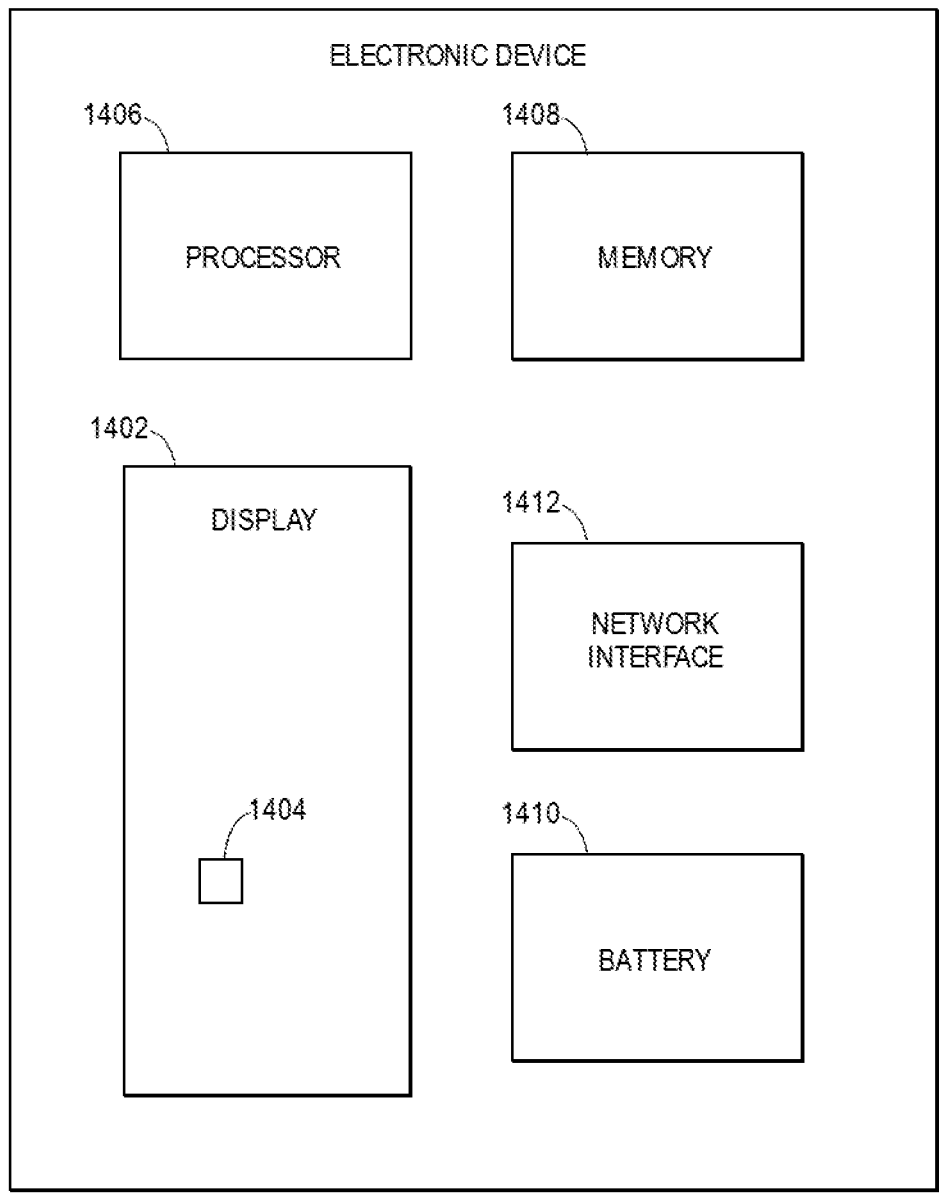
FIG. 14 is an electronic device having a display, in accordance with embodiments of the present disclosure.

FIG. 14 is an electronic device having a display, in accordance with embodiments of the present disclosure. Referring to FIG. 14, an electronic device 1400 has a display or display panel 1402 with a micro-structure 1404. The display may also have glass layers and other layers, circuitry, and so forth. The display panel 1402 may be a micro-LED display panel. As should be apparent, only one microstructure 1404 is depicted for clarity, though a display panel 1402 will have an array or arrays of microstructures including nanowire LEDs, some of which may be associated with phosphor layers.

The electronic device 1400 may be a mobile device such as smartphone, tablet, notebook, smartwatch, and so forth. The electronic device 1400 may be a computing device, stand-alone display, television, display monitor, vehicle computer display, the like. Indeed, the electronic device 1400 may generally be any electronic device having a display or display panel.

The electronic device 1400 may include a processor 1406 (e.g., a central processing unit or CPU) and memory 1408. The memory 1408 may include volatile memory and nonvolatile memory. The processor 1406 or other controller, along with executable code store in the memory 1408, may provide for touchscreen control of the display and well as for other features and actions of the electronic device 1400.

In addition, the electronic device 1400 may include a battery 1410 that powers the electronic device including the display panel 1402. The device 1400 may also include a network interface 1412 to provide for wired or wireless coupling of the electronic to a network or the internet. Wireless protocols may include Wi-Fi (e.g., via an access point or AP), Wireless Direct®, Bluetooth®, and the like. Lastly, as is apparent, the electronic device 1400 may include additional components including circuitry and other components.

Thus, embodiments described herein include micro light-emitting diode displays having nanophosphors, and methods of fabricating micro light-emitting diode displays having nanophosphors.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: A micro light emitting diode pixel structure includes a substrate having a plurality of conductive interconnect structures in a first dielectric layer thereon. A plurality of micro light emitting diode devices is in a second dielectric layer above the first dielectric layer, individual ones of the plurality of micro light emitting diode devices electrically coupled to a corresponding one of the plurality of conductive interconnect structures, the plurality of micro light emitting diode devices including a first blue micro light emitting diode device, a second blue micro light emitting diode device, and a green micro light emitting diode device. A transparent conducting oxide layer is disposed on the plurality of micro light emitting diode devices and on the second dielectric layer. A phosphor layer is on the transparent conducting oxide layer at a location vertically aligned with the first blue micro light emitting diode device but not at a location vertically aligned with the second blue micro light emitting diode device.

Example embodiment 2: The micro light emitting diode pixel structure of example embodiment 1, wherein the substrate is a silicon substrate including metal oxide semiconductor (CMOS) devices or thin film transistor (TFT) devices coupled to the plurality of conductive interconnect structures.

Example embodiment 3: The micro light emitting diode pixel structure of example embodiment 1 or 2, wherein the phosphor layer includes InGaN-based phosphors in a matrix.

Example embodiment 4: The micro light emitting diode pixel structure of example embodiment 3, wherein each of the InGaN-based phosphors includes a GaN core and an InGaN shell on the GaN core.

Example embodiment 5: The micro light emitting diode pixel structure of example embodiment 4, wherein the GaN core includes a structure selected from the group consisting of a nanowire structure, a nanopyramid structure, and an axial nanowire structure.

Example embodiment 6: The micro light emitting diode pixel structure of example embodiment 3, 4 or 5, wherein the matrix is a photoresist matrix.

Example embodiment 7: The micro light emitting diode pixel structure of example embodiment 1, 2, 3, 4, 5 or 6, wherein the plurality of micro light emitting diode devices does not include a red micro light emitting diode device, and wherein the phosphor layer is a red phosphor layer.

Example embodiment 8: The micro light emitting diode pixel structure of example embodiment 1, 2, 3, 4, 5, 6 or 7, wherein the first and second dielectric layers are low-k dielectric layers.

Example embodiment 9: The micro light emitting diode pixel structure of example embodiment 1, 2, 3, 4, 5, 6, 7 or 8, wherein the transparent conducting oxide layer is an indium tin oxide (ITO) layer.

Example embodiment 10: The micro light emitting diode pixel structure of example embodiment 1, 2, 3, 4, 5, 6, 7, 8 or 9, wherein the plurality of micro light emitting diode devices is a plurality of GaN nanowire-based micro light emitting diode devices.

Example embodiment 11: A method of fabricating a micro light emitting diode pixel structure includes providing a first wafer having a plurality of conductive interconnect structures in a first dielectric layer thereon. The method also includes providing a second wafer having a plurality of micro light emitting diode devices in a second dielectric thereon, the plurality of micro light emitting diode devices including a first blue micro light emitting diode device, a second blue micro light emitting diode device, and a green micro light emitting diode device. The method also includes coupling the first and second wafers to provide individual ones of the plurality of micro light emitting diode devices electrically coupled to a corresponding one of the plurality of conductive interconnect structures; removing the second wafer. The method also includes forming a transparent conducting oxide layer on the plurality of micro light emitting diode devices and on the second dielectric layer. The method also includes forming a phosphor layer on the transparent conducting oxide layer at a location vertically aligned with the first blue micro light emitting diode device but not at a location vertically aligned with the second blue micro light emitting diode device.

Example embodiment 12: The method of example embodiment 11, wherein the first wafer is a silicon substrate including metal oxide semiconductor (CMOS) devices or thin film transistor (TFT) devices coupled to the plurality of conductive interconnect structures.

Example embodiment 13: The method of example embodiment 11 or 12, wherein the phosphor layer includes InGaN-based phosphors in a matrix.

Example embodiment 14: The method of example embodiment 13, wherein each of the InGaN-based phosphors includes a GaN core and an InGaN shell on the GaN core.

Example embodiment 15: The method of example embodiment 14, wherein the GaN core includes a structure selected from the group consisting of a nanowire structure, a nanopyramid structure, and an axial nanowire structure.

Example embodiment 16: The method of example embodiment 13, 14 or 15, wherein the matrix is a photoresist matrix.

Example embodiment 17: The method of example embodiment 11, 12, 13, 14, 15 or 16, wherein the plurality of micro light emitting diode devices does not include a red micro light emitting diode device, and wherein the phosphor layer is a red phosphor layer.

Example embodiment 18: The method of example embodiment 11, 12, 13, 14, 15, 16 or 17, wherein the first and second dielectric layers are low-k dielectric layers.

Example embodiment 19: The method of example embodiment 11, 12, 13, 14, 15, 16, 17 or 18, wherein the transparent conducting oxide layer is an indium tin oxide (ITO) layer.

Example embodiment 20: The method of example embodiment 11, 12, 13, 14, 15, 16, 17, 18 or 19, wherein the plurality of micro light emitting diode devices is a plurality of GaN nanowire-based micro light emitting diode devices.

Example embodiment 21: A phosphor layer for converting blue light from a micro light emitting diode device to red light includes a matrix, and a plurality of InGaN-based phosphors in the matrix, wherein each of the plurality of InGaN-based phosphors includes a GaN core and an InGaN shell on the GaN core.

Example embodiment 22: The phosphor layer of example embodiment 21, wherein each of the plurality of InGaN-based phosphors includes a GaN core and an InGaN shell on the GaN core.

Example embodiment 23: The phosphor layer of example embodiment 22, wherein the GaN core includes a structure selected from the group consisting of a nanowire structure, a nanopyramid structure, and an axial nanowire structure.

Example embodiment 24: The phosphor layer of example embodiment 21, 22 or 23, wherein the matrix is a photoresist matrix.

What is claimed is:

1. A micro light emitting diode pixel structure, comprising:
    a substrate having a plurality of conductive interconnect structures in a first dielectric layer thereon;
    a plurality of micro light emitting diode devices in a second dielectric layer above the first dielectric layer, each of the plurality of micro light emitting diode devices comprising a core and a shell, and individual ones of the plurality of micro light emitting diode devices electrically coupled to a corresponding one of the plurality of conductive interconnect structures, the plurality of micro light emitting diode devices including a first blue micro light emitting diode device, a second blue micro light emitting diode device, and a green micro light emitting diode device;
    a transparent conducting oxide layer disposed on an uppermost surface of the plurality of micro light emitting diode devices and on the second dielectric layer, the transparent conducting oxide layer in contact with the core of each of the plurality of micro light emitting diode devices; and
    a phosphor layer directly on and in physical contact with the transparent conducting oxide layer at a location vertically aligned with the first blue micro light emitting diode device but not at a location vertically aligned with the second blue micro light emitting diode device.

2. The micro light emitting diode pixel structure of claim 1, wherein the substrate is a silicon substrate comprising metal oxide semiconductor (CMOS) devices or thin film transistor (TFT) devices coupled to the plurality of conductive interconnect structures.

3. The micro light emitting diode pixel structure of claim 1, wherein the phosphor layer comprises InGaN-based phosphors in a matrix.

4. The micro light emitting diode pixel structure of claim 3, wherein each of the InGaN-based phosphors comprises a GaN core and an InGaN shell on the GaN core.

5. The micro light emitting diode pixel structure of claim 4, wherein the GaN core comprises a structure selected from the group consisting of a nanowire structure, a nanopyramid structure, and an axial nanowire structure.

6. The micro light emitting diode pixel structure of claim 3, wherein the matrix is a photoresist matrix.

7. The micro light emitting diode pixel structure of claim 1, wherein the plurality of micro light emitting diode devices does not include a red micro light emitting diode device, and wherein the phosphor layer is a red phosphor layer.

8. The micro light emitting diode pixel structure of claim 1, wherein the first and second dielectric layers are low-k dielectric layers.

9. The micro light emitting diode pixel structure of claim 1, wherein the transparent conducting oxide layer is an indium tin oxide (ITO) layer.

10. The micro light emitting diode pixel structure of claim 1, wherein the plurality of micro light emitting diode devices is a plurality of GaN nanowire-based micro light emitting diode devices.

11. A phosphor layer for converting blue light from a micro light emitting diode device to red light, the phosphor layer comprising:
    a matrix; and
    a plurality of InGaN-based phosphors in the matrix, wherein each of the plurality of InGaN-based phosphors comprises a GaN core and an InGaN shell on the GaN core.

12. The phosphor layer of claim 11, wherein the GaN core comprises a structure selected from the group consisting of a nanowire structure, a nanopyramid structure, and an axial nanowire structure.

13. The phosphor layer of claim 11, wherein the matrix is a photoresist matrix.

14. A micro light emitting diode pixel structure, comprising:
    a substrate having a plurality of conductive interconnect structures in a first dielectric layer thereon;
    a plurality of micro light emitting diode devices in a second dielectric layer above the first dielectric layer, individual ones of the plurality of micro light emitting diode devices electrically coupled to a corresponding one of the plurality of conductive interconnect structures, the plurality of micro light emitting diode devices including a first blue micro light emitting diode device, a second blue micro light emitting diode device, and a green micro light emitting diode device;
    a transparent conducting oxide layer disposed on the plurality of micro light emitting diode devices and on the second dielectric layer an uppermost surface of; and
    a phosphor layer on the transparent conducting oxide layer at a location vertically aligned with the first blue micro light emitting diode device but not at a location vertically aligned with the second blue micro light emitting diode device, wherein the phosphor layer comprises InGaN-based phosphors in a matrix, and wherein each of the InGaN-based phosphors comprises a GaN core and an InGaN shell on the GaN core.

15. The micro light emitting diode pixel structure of claim 14, wherein the GaN core comprises a structure selected from the group consisting of a nanowire structure, a nanopyramid structure, and an axial nanowire structure.

* * * * *